US012718976B2

(12) United States Patent
Hansen et al.

(10) Patent No.: US 12,718,976 B2
(45) Date of Patent: Aug. 25, 2026

(54) MAGNETIC CORE OF AN ELECTRONIC ASSEMBLY

(71) Applicant: Robert Bosch GmbH, Stuttgart (DE)

(72) Inventors: Jan Hansen, Renningen (DE); Konstantin Spanos, Nagold (DE)

(73) Assignee: Robert Bosch GmbH, Stuttgart (DE)

( * ) Notice: Subject to any disclaimer, the term of this patent is extended or adjusted under 35 U.S.C. 154(b) by 1050 days.

(21) Appl. No.: 17/793,948

(22) PCT Filed: Dec. 23, 2020

(86) PCT No.: PCT/EP2020/087746
§ 371 (c)(1),
(2) Date: Jul. 20, 2022

(87) PCT Pub. No.: WO2021/148219
PCT Pub. Date: Jul. 29, 2021

(65) Prior Publication Data

US 2023/0050004 A1 Feb. 16, 2023

(30) Foreign Application Priority Data

Jan. 21, 2020 (DE) ..................... 10 2020 200 619.9

(51) Int. Cl.
*H01F 17/06* (2006.01)
*H01F 3/10* (2006.01)
*H05K 1/181* (2026.01)

(52) U.S. Cl.
CPC ............... *H01F 17/06* (2013.01); *H01F 3/10* (2013.01); *H05K 1/181* (2013.01); *H01F 2017/065* (2013.01)

(58) Field of Classification Search
CPC ....... H01F 17/06; H01F 3/10; H01F 2017/065
See application file for complete search history.

(56) References Cited

U.S. PATENT DOCUMENTS 7,280,025 B2 * 10/2007 Sano ........................ H01F 17/06 336/200
7,352,269 B2 * 4/2008 Li ........................... H02M 1/14 336/170

(Continued)

FOREIGN PATENT DOCUMENTS

CN 204680522 U 9/2015
CN 110506316 A 11/2019

(Continued)

OTHER PUBLICATIONS

Translation of International Search Report for Application No. PCT/EP2020/087746 dated Mar. 30, 2021 (2 pages).

*Primary Examiner* — Shawki S Ismail
*Assistant Examiner* — Joselito S. Baisa
(74) *Attorney, Agent, or Firm* — Michael Best & Friedrich LLP

(57) ABSTRACT

The invention relates to a magnetic core (1) of an electronic arrangement, comprising a center region (3), a base (4*a*), which is formed in the shape of a planar plate, and a cover (4*b*), wherein the center region (3) is arranged between the base (4*a*) and the cover (4*b*), wherein a through-opening (2) with a center line (X) is formed in the center region (3), wherein a first cross-sectional area (9) of the magnetic core (1) in a first section plane (6), which is parallel to the base (4*a*) and in which the center line (X) is located, is substantially equal to a second cross-sectional area (8) of the magnetic core (1) in a second section plane (7), which is perpendicular to the first section plane (6) and in which the center line (X) is located, and wherein the base (4*a*) and the cover (4*b*) protrude beyond the center region (3) in the direction of the center line (X) on at least two mutually opposing sides.

20 Claims, 3 Drawing Sheets

(56) References Cited

U.S. PATENT DOCUMENTS

| | | | | |
|---|---|---|---|---|
| 7,679,482 | B2 * | 3/2010 | Yamada | H01F 17/043<br>336/212 |
| 8,350,658 | B1 * | 1/2013 | Stratakos | H01F 17/06<br>336/212 |
| 9,967,994 | B2 * | 5/2018 | Ikezawa | H01F 37/00 |
| 11,881,716 | B2 * | 1/2024 | Luzinski | H02J 50/70 |
| 2005/0231316 | A1 | 10/2005 | Sato | |
| 2008/0246577 | A1 * | 10/2008 | Sullivan | H01F 17/06<br>336/184 |
| 2013/0308348 | A1 | 11/2013 | Liu et al. | |
| 2017/0032888 | A1 * | 2/2017 | Park | H01F 27/325 |
| 2017/0104419 | A1 | 4/2017 | Zeng et al. | |
| 2017/0178794 | A1 | 6/2017 | Yan et al. | |
| 2017/0178795 | A1 * | 6/2017 | Todorov | H05K 3/308 |
| 2020/0043643 | A1 * | 2/2020 | Yan | H01F 27/306 |
| 2022/0200356 | A1 * | 6/2022 | Luzinski | H02J 50/005 |

FOREIGN PATENT DOCUMENTS

| | | | | | |
|---|---|---|---|---|---|
| CN | 116487157 | A | * | 7/2023 | H02J 7/70 |
| DE | 3333460 | A1 | | 4/1985 | |
| JP | H0279618 | U | | 6/1990 | |
| JP | H02123121 | U | | 10/1990 | |
| JP | H04121712 | U | | 10/1992 | |
| JP | H08264326 | A | | 10/1996 | |
| JP | 2002134330 | A | | 5/2002 | |
| JP | 2002164219 | A | | 6/2002 | |
| JP | 2004266217 | A | * | 9/2004 | |
| JP | 2015061144 | A | | 3/2015 | |
| WO | WO-2017073995 | A1 | * | 5/2017 | H01F 27/2804 |

* cited by examiner

10
X
60
36
Z
92
1
Y
6
9
11
32
60
20
40
91
31
4a

40'
10
1
Z
4b
4
3
20
60
48
35
60
50
2
4a
15
6, X
30
40

MAGNETIC CORE OF AN ELECTRONIC ASSEMBLY

BACKGROUND

The present invention relates to a magnetic core of an electronic assembly with optimized use of space, and an electronic assembly comprising such a magnetic core.

The use of magnetic cores in power electronics components, for example for storing electric energy or for filtering out cable-related interference, is common. U-shaped or E-shaped magnetic cores, as described for example in DE 3333460 A1, are known. Such magnetic cores usually need a lot of space compared to other electronic components, whereby the magnetic cores essentially determine the spatial requirement of the power electronics components.

SUMMARY

In contrast, the inventive magnetic core offers the advantage of a geometry which is optimized in terms of its spatial requirement. This enables high inductance of the magnetic core with a small height and length of the magnetic core overall. This is achieved according to the invention by a magnetic core which comprises a center region, a base and a cover. The base is formed in the shape of a planar plate. In this case, a planar plate is seen as a substantially plate-shaped part which has at least a planar upper side, wherein the upper side faces in particular in the direction of the center region. In this case, the base is preferably formed as a cuboid. However, other geometrical shapes of the base are also fundamentally possible, for example as a curved plate, or as a circular segment, wherein at least part of the upper side of the base is planar.

The center region is arranged between the base and the cover. A through-opening, which has a center line, is formed in the center region. The through-opening is formed in particular entirely in the center region. In this case, the through-opening preferably has a rectangular or square cross section.

In this case, a first cross-sectional area of the center region in a first section plane is substantially equal to a second cross-sectional area of the magnetic core in a second section plane. In this case, the first section plane is parallel to the base and arranged such that the center line is located in the first section plane. Half of the first cross-sectional area thus corresponds to a magnetic cross-sectional area of the center region. The second section plane is perpendicular to the first section plane and likewise arranged such that the center line is located in the second section plane. Half of the second cross-sectional area therefore corresponds to a magnetic cross-sectional area of the base and the cover. The size of this first and second cross-sectional area, and therefore the magnetic cross-sectional areas, essentially determines the inductance of the magnetic core. In this case, the first cross-sectional area and the second cross-sectional area are preferably exactly equal in size.

The base and the cover furthermore protrude beyond the center region in the direction of the center line on at least two mutually opposing sides. In other words, a first length of the center region of the magnetic core in the direction of the center line is smaller than a second, respective length of the base and the cover in the direction of the center line. This means that the base and the cover each form a type of canopy, for example, which protrudes beyond the center region. A particularly compact geometry of the magnetic core can thus be achieved, in particular in the center region, wherein, in particular, a high, desired inductance of the magnetic core is ensured by the first cross-sectional area, which is substantially equal to the second cross-sectional area. As a result of the smaller axial length of the center region, a particularly compact geometry of the magnetic core can be achieved here. More space can thus be provided for further elements. For example, to this end, electronic components, for example capacitors or the like, can be arranged very close to the center region and preferably underneath the canopy formed by the base and the cover. As a result of the present magnetic core, a device in which the magnetic core is used can be shortened in length whilst the height of the magnetic core or device is maintained. This is particularly favorable if a printed circuit board is arranged in the though-opening, for example. Moreover, configuring the base and the cover such that they protrude in the direction of the center line offers the advantage that they can have smaller dimensions in the direction of a Z axis, which is perpendicular to the first section plane, whilst the required size of the first cross-sectional area can still be ensured. A magnetic core having a high inductance with a particularly small total height in the direction of the Z axis can thus be provided. This means in particular that, whilst maintaining the inductance, the special geometry of the magnetic core enables the length of the magnetic core to be shortened in the center region without having to increase the total height. In order to ensure the required cross-sectional area of the center region in the first section plane, this center region can be widened for example in the transverse direction.

The subclaims have preferred developments of the invention as their content.

The magnetic core is preferably made from a material which comprises a ferrite and/or an iron powder material. Such magnetic cores are produced for example by sintering or injection, in particular in a mold, thereby enabling particularly simple and cost-effective production with flexible shaping.

The base and the cover preferably each protrude by at least 5%, especially by at least 10%, particularly preferably by a maximum of 50%, of a length of the center region in order to enable a particularly compact geometry of the magnetic core in terms of a longitudinal extent of the center region.

The center region particularly preferably has a first height in a direction perpendicular to the base, wherein the first height is at least 10%, especially at least 20%, preferably a maximum of 40% and particularly preferably 30%, of a total height of the magnetic core in the direction perpendicular to the base. An optimum geometry of the magnetic core in terms of the height of the magnetic core is thus ensured, in particular to achieve a small total height with a high, desired inductance and sufficient space for further electronic components.

The base and the cover preferably protrude beyond the center region in the direction of the center line on both sides. In this case, the base and the cover particularly preferably protrude beyond the center line symmetrically, i.e. the magnetic core preferably has a symmetrical geometry relative to a transverse plane which is perpendicular to the center line. In this case, the magnetic core has a T shape when viewed from the side. In addition to a particularly compact geometry, an even distribution of a magnetic flux density and a magnetic field strength can thus be achieved.

The through-opening further preferably extends from the base to the cover. This means that the though-opening divides the center region in particular into two separate regions. The center region therefore preferably comprises a first wall and a second wall. The two walls are each arranged at a predetermined spacing from the center line, for example. The walls can have any cross section. Each of the walls particularly preferably has a rectangular cross section. This enables particularly simple and cost-effective production of the magnetic core.

The base and the cover are preferably formed in the shape of two cuboidal plates. The two plates preferably have an identical geometry. Alternatively, the two plates can also have different geometries, for example different widths, provided the cross-sectional areas remain equal. The two plates are preferably arranged parallel to one another, and in particular perpendicularly to the walls. The magnetic core is thus particularly easy to produce and enables a large magnetic cross-sectional area in the region of the base and the cover.

The magnetic core is advantageously formed in two parts. In this case, the base is preferably provided separately from the center region, which is formed in particular in one piece with the cover. The base and the center region can preferably be connected to one another, for example by means of an adhesive connection or by means of a plug connection, wherein the plug connection is enabled in particular by means of a plug element which is made from plastic and into which the base and the center region are inserted. Alternatively, the base and the center region can be unconnected. The two-part form of the magnetic core enables particularly simple and cost-effective production of the magnetic core, wherein its assembly can also be simplified in particular for applications in an electronic assembly, for example in that the magnetic core can be assembled around a printed circuit board.

A gap, preferably an air gap, is preferably formed between the center region and the base. This means that the magnetic core consists of two separate parts, which are arranged at a predefined minimum spacing from one another so that the gap is formed between them. In this case, a first part comprises the center region and the cover, wherein the center region and the cover are preferably formed together in one piece. A second part of the magnetic core is preferably the base, which is arranged such that the gap is present between it and the center region. As a result of the construction with a gap, it is therefore possible to prevent core saturation under high currents. The magnetic core preferably comprises a spacer in order to ensure the gap between the two parts of the magnetic core. The spacer is preferably made from a magnetically non-conductive material, for example plastic. By way of example, the two parts can be connected to one another via a plug connection using a plug element, wherein the plug element in particular forms the spacer.

The center region, the base and the cover are particularly preferably formed in one piece. This means that, when viewed in the direction of the center line, a one-piece, substantially O-shaped magnetic core, is produced, which is closed in the circumferential direction, in particular without a gap.

The magnetic core preferably comprises two center regions, each with a through-opening. In this case, the two center regions are arranged directly adjoining one another in a direction perpendicular to the second section plane. The two through-openings are preferably parallel to one another. The magnetic core is therefore formed in particular in an E shape.

In this case, by way of example, part of the printed circuit board can be arranged in both through-openings in each case. The two center regions are preferably formed in one piece, i.e. a center wall is preferably arranged between the two through-openings, which center wall is formed in particular by the two mutually adjoining walls of the two center regions. The center wall therefore preferably has twice the cross-sectional area of one of the walls of the center regions. In particular, in the magnetic core with two center regions, the first cross-sectional areas of the two center regions are considered to be separate in each case. This means that each of the two center regions has a separate first cross-sectional area in each case, which is substantially equal to the second cross-sectional area in the second section plane. A gap is particularly preferably provided between the center wall and the base, wherein the outer walls in particular each abut against the base without a gap. Alternatively, a gap can also preferably be provided in each case between the outer walls and the base.

The invention furthermore leads to an electronic assembly which comprises a magnetic core, described above, and a printed circuit board. By way of example, the electronic assembly can be a power electronics component, in particular for application in a vehicle, for example in a control unit of a vehicle. In this case, the printed circuit board projects through the through-opening of the magnetic core and is arranged parallel to the base of the magnetic core. The magnetic core thus in particular enables a current smoothing or filtering out of cable-related interference during operation of the electronic assembly. The electronic assembly can preferably furthermore comprise a housing within which the printed circuit board and the magnetic core are arranged.

The electronic assembly preferably furthermore comprises at least one electronic component, which is arranged on the printed circuit board. In this case, the electronic component is arranged such that it is at least partially covered by the base and the cover of the magnetic core, whereby the electronic assembly is kept particularly compact. This means that the electronic component is preferably arranged at least partially within a space which is defined by the cover and the base. The electronic component can be, for example, a capacitor or another surface mounted component, also known as a surface mounted device, SMD for short. As a result of the special geometry of the magnetic core with the shortened axial length in the region of the printed circuit board, particularly small dimensions of the electronic assembly can be achieved in particular in the direction of the center line, whilst the total height of the magnetic core and the electronic assembly can be maintained. The electronic assembly is therefore especially suited to applications with a limited installation space, for instance in control units in a vehicle.

BRIEF DESCRIPTION OF THE DRAWINGS

The invention is described below with the aid of exemplary embodiments and in conjunction with the figures. Functionally identical components are each denoted by identical reference signs in the figures, wherein.

DETAILED DESCRIPTION

Figure 1:
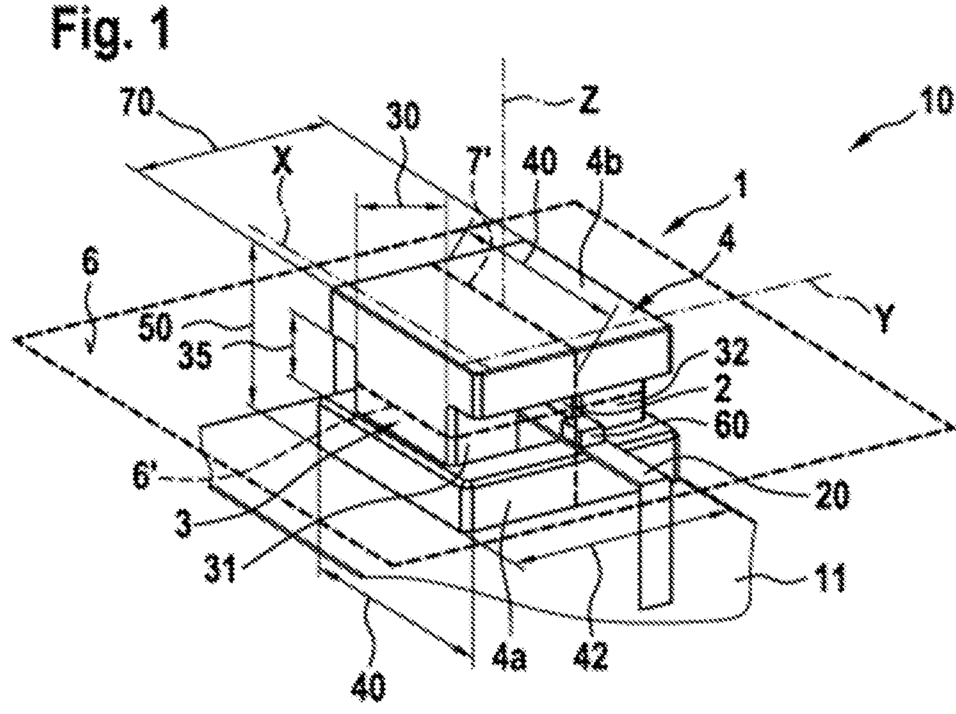
FIG. 1 shows a perspective view of an electronic assembly with a magnetic core according to a first exemplary embodiment of the invention.
Figure 2:
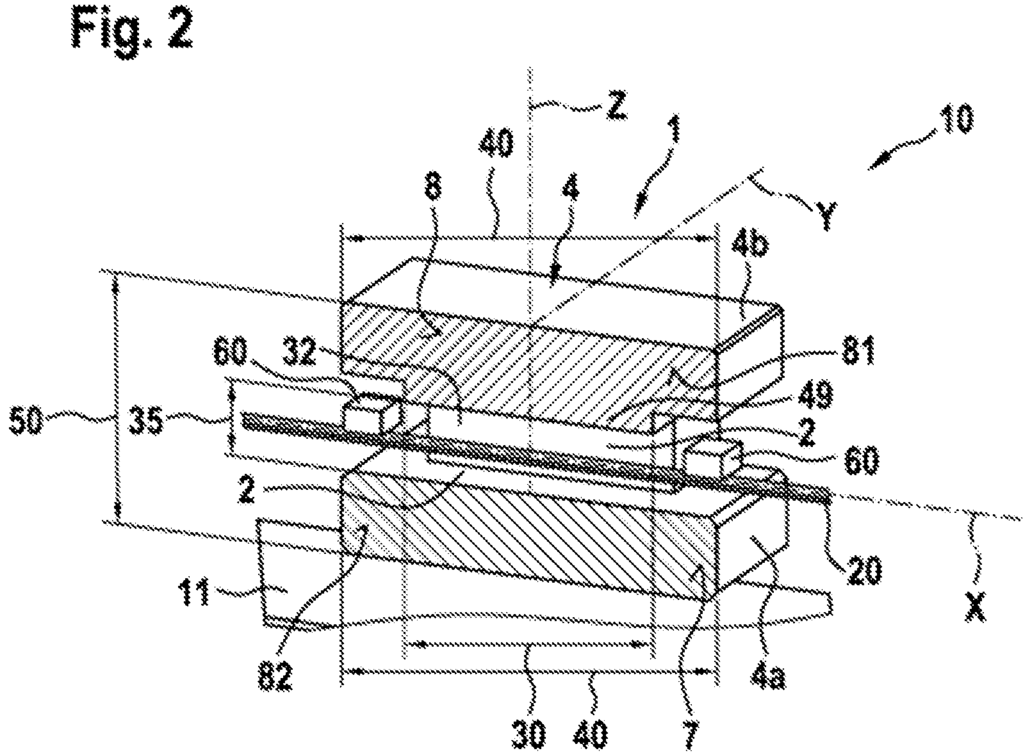
FIG. 2 shows a sectional view of FIG. 1.
Figure 3:
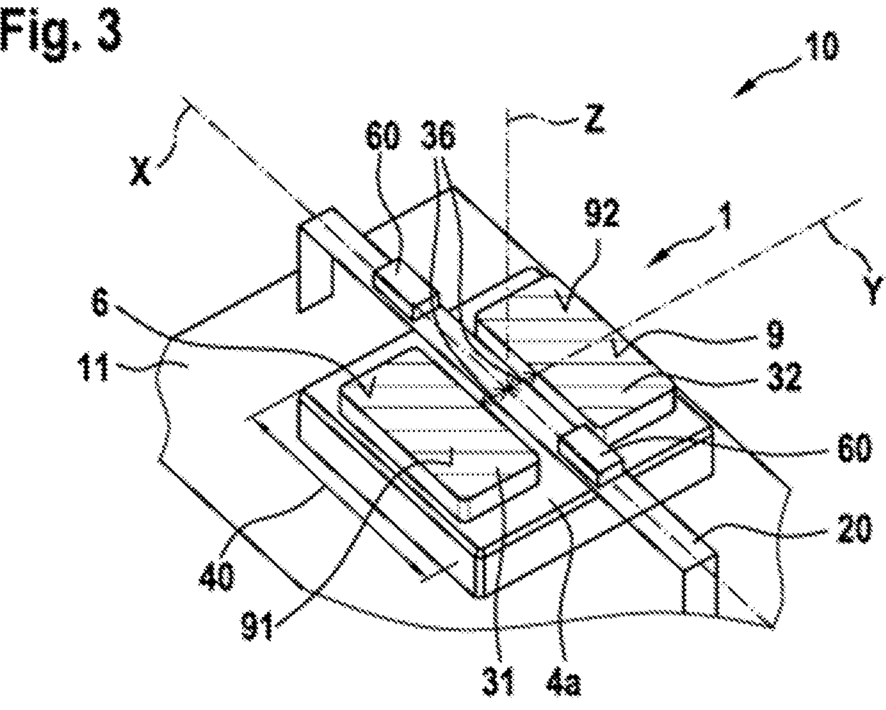
FIG. 3 shows a further sectional view of FIG. 1.

FIGS. 1 to 3 shows an electronic assembly 10 with a magnetic core 1 according to a first exemplary embodiment of the invention. For orientation, an X axis, a Y axis and a Z axis are each drawn perpendicular to one another.

In this case, FIG. 1 shows a perspective view of the electronic assembly 10. FIG. 2 shows a sectional view of FIG. 1, wherein a second section plane 7 is defined by the X axis and the Z axis. FIG. 3 shows a further sectional view of FIG. 1 with an alternative first section plane 6, which is defined by the X axis and the Y axis. For clarification, in FIG. 1, a first section line 6' corresponding to the section in the first section plane 6 and a second section line 7' corresponding to the section in the second section plane 7 are each denoted by dashed lines on the magnetic core 1.

The electronic assembly 10 is arranged in particular within a housing, wherein a housing base 11 of the housing is indicated schematically in FIGS. 1 to 3.

The electronic assembly 10 comprises the magnetic core 1 and a printed circuit board 20. The printed circuit board 20 extends along the X axis, and is arranged in particular in the first section plane defined by the X axis and the Y axis. In this case, the magnetic core 1 has a through-opening 2 with a center line X, wherein the center line X corresponds to the X axis. The printed circuit board 20 extends through the through-opening 2.

The through-opening 2 has a rectangular cross section and is formed in a center region 3 of the magnetic core 1. In detail, the through-opening 2 divides the center region 3 into two separate walls 31, 32, as can be seen in particular in FIG. 3. The two walls 31, 32, as can be seen in FIG. 2, are preferably connected to one another by means of a connecting region 49, for example to make use of the available installation space in an optimum manner and/or to facilitate manufacture.

The two walls 31, 32 are formed symmetrically with respect to the center line X, i.e. the two walls 31, 32 are each arranged at a predefined spacing 36 from the center line X, extend parallel to the Z axis in each case and have an identical, substantially rectangular cross-sectional wall area 91, 92 in each case in the section plane.

The magnetic core 1 furthermore comprises a base 4*a* and a cover 4*b*, which are each formed as substantially cuboidal, planar plates. The center region 3 is arranged between the base 4*a* and the cover 4*b*, in particular in the direction of the Z axis. In this case, the cover 4*b* and the center region 3 are formed in one piece, thereby producing a U-shaped solid body as viewed in the direction of the center line X.

The base 4*a* and the center region 3 are arranged directly adjoining one another, i.e. without a gap.

As can be seen in FIG. 1, the center region 3 and the cover 4*b* have an equal second width 70 in the direction of the Y axis. In this case, a first width 42 of the base 4*a* is slightly larger; alternatively, it can also be equal to the second width 70.

In the direction of the X axis, the center region 3 has a first length 30 which is different from that of the base 4*a* and the cover 4*b*. In this case, the first length 30 of the center region 3 is 30% smaller than a second, respective length 40 of the base 4*a* and the cover 4*b*. In this case, the center region 3 and the base 4*a* and the cover 4*b* are arranged such that the base 4*a* and the cover 4*b* each protrude beyond the center region 3 in the direction of the center line X in a manner similar to a canopy.

The magnetic core 1, which is shortened in the region of the center region 3, therefore offers more space for enabling electronic components 60, for example capacitors or other surface mounted components, to be fastened on the printed circuit board 20. Such electronic components 60 are generally considerably smaller than the magnetic core 1, whereby they can be arranged on the printed circuit board 20 such that they are at least partially covered by the base 4*a* and the cover 4*b*. This means that, in this case, the electronic components 60 are arranged at least partially within a space which is defined by the base 4*a* and the cover 4*b*. A particularly space-saving overall size of the electronic assembly 10 can thus be enabled, which is particularly advantageous for applications in a control unit of a motor vehicle, for example, in which there is normally very limited space. In this case, the installation space is normally limited in particular in the direction of the center line and/or the Z axis, with the special construction with the center region 3, the base 4*a* and the cover 4*b* enabling optimum use of the space and therefore high inductance of the particularly compact magnetic core 1.

To optimize the space for electronic components 60 on the printed circuit board, it is particularly advantageous if a first height 35 of the center region 3 is approximately 30% of a total height 50 of the magnetic core 1 (c.f. FIG. 2). In particular, a very small overall height of the magnetic core can thus be enabled, wherein optimum magnetic properties are ensured as a result of the special geometry of the magnetic core 1, as described below.

The magnetic core 1 is specially configured such that, despite the particularly compact geometry, it has very high inductance in order to ensure good effectiveness, for example for filtering out electrical and/or magnetic interference. To this end, the center region 3, the base 4*a* and the cover 4*b* are configured such that equal cross-sectional areas 8, 9 are realized in each case, which each make use of the available installation space in an optimum manner.

In this case, a second cross-sectional area 8 corresponds to the total section area (illustrated in FIG. 2) in the second section plane 7, which is defined by the X axis and the Z axis. This means that the second cross-sectional area 8 corresponds to the sum of the two cross-sectional areas 81, 82 of the base 4*a* and the cover 4*b*. The two cross-sectional areas 81, 82 of the base 4*a* and the cover 4*b* correspond to the magnetic cross-sectional area of the cover 4*b* and base 4*a* in each case.

A first cross-sectional area 9 furthermore corresponds to the total section area (illustrated in FIG. 3) in the first section plane 6. This means that the first cross-sectional area 9 corresponds to the sum of the two cross-sectional areas 91, 92 of the two walls 31, 32. The two cross-sectional areas 91, 92 of the two walls 31, 32 correspond to the magnetic cross-sectional area of the center region 3 in each case.

Figure 4:
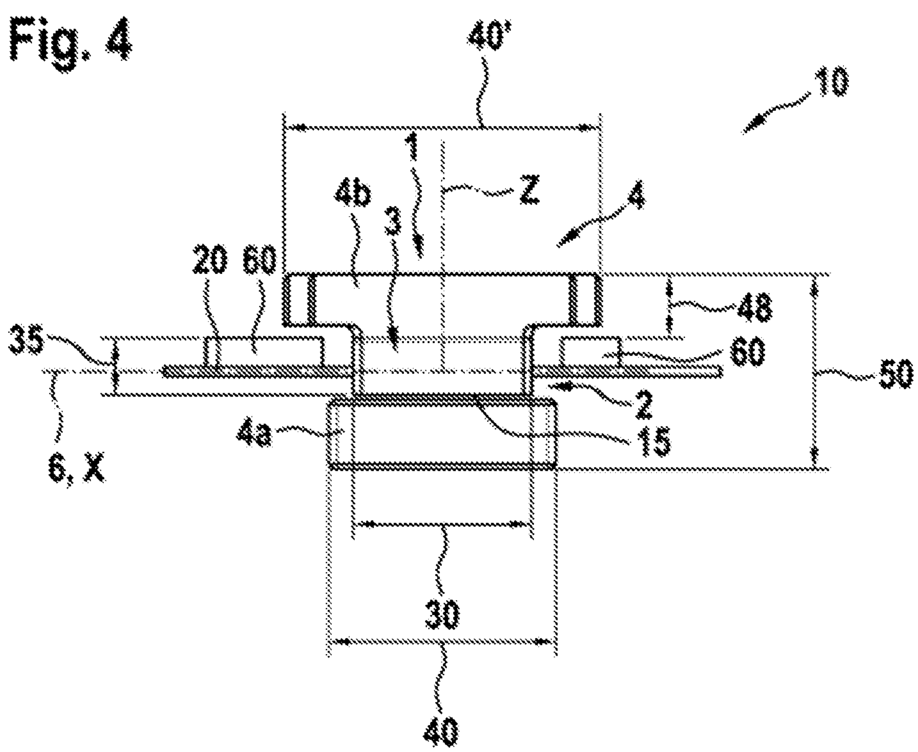
FIG. 4 shows an electronic assembly with a magnetic core according to a second exemplary embodiment of the invention.

FIG. 4 shows an electronic assembly 10 with a magnetic core 1 according to a second exemplary embodiment of the invention. In this case, the second exemplary embodiment corresponds substantially to the first exemplary embodiment of FIGS. 1 to 3, with the difference that the cover 4*b* has a greater second axial length 40' and that a gap 15 is formed between the center region 3 and the base 4*a*. In this case, the second axial length 40' is at least 10% greater than the first axial length 40 of the base 4*a*. The total height 50 of the magnetic core 1 can thus be further reduced in that the height 48 is reduced compared to the first exemplary embodiment.

A sufficiently large second cross-sectional area 8 of the cover 4*b* is still ensured as a result of the longer cover 4*b* in the direction of the center line in order to ensure high inductance of the magnetic core 1. The gap 15 can be ensured for example by a spacer (not illustrated), which is made of a magnetically non-conductive material. By way of example, the base 4*a* and the center region 3 can moreover each be inserted into a plug element, preferably in order to ensure a plug connection between the base 4*a* and the center region 3, wherein the plug element can form the spacer, for example.

Figure 5:
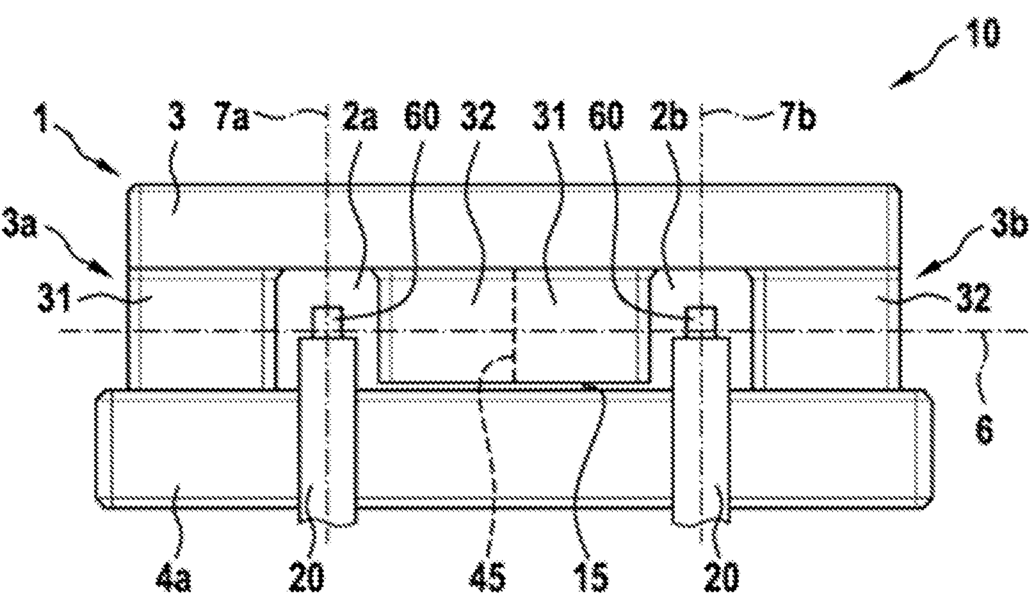
FIG. 5 shows an electronic assembly with a magnetic core according to a third exemplary embodiment of the invention.

FIG. 5 shows an electronic assembly 10 with a magnetic core 1 according to a third exemplary embodiment of the invention. In this case, the third exemplary embodiment corresponds substantially to the first exemplary embodiment of FIGS. 1 to 3, with the difference that two center regions 3*a*, 3*b*, each with a through-opening 2*a*, 2*b*, are provided. Furthermore, in the third exemplary embodiment of FIG. 5, there is a gap between the center wall 3*c* and the base 4*a*, wherein the two outer walls 32, 31 are arranged without a gap on the base 4*a* in order to maintain a particularly favorable distribution of the magnetic flux density and the magnetic field strength in the magnetic core 1.

The two center regions 3*a*, 3*b* are each arranged between the base 4*a* and the cover 3 and directly adjoining one another along a direction perpendicular to the second section plane 7*a*, 7*b*. In this case, a virtual boundary surface 45 is denoted between the two center regions 3*a*, 3*b*. In detail, on the inside, a second wall 32 of the first center region 3*a* and a first wall 31 of the second center region 3*b* are formed in one piece as a center wall 3*c*. The center wall 3*c* therefore has twice the cross-sectional area of the individual walls 31, 32.

The cross-sectional areas of the two center regions 3*a*, 3*b* are considered to be separate in the third exemplary embodiment. This means that the total cross-sectional area of the magnetic core 1 in the first section plane 6 is twice the first cross-sectional area 8 of each of the center regions 3*a*, 3*b*, wherein the second section plane 7*a*, 7*b* is therefore defined separately for each center region 3*a*, 3*b*.

The invention claimed is:

1. A magnetic core of an electronic assembly, comprising:
- a center region (3),
- a base (4*a*), which is formed in the shape of a planar plate, and
- a cover (4*b*),
- wherein the center region (3) is arranged between the base (4*a*) and the cover (4*b*),
- wherein a through-opening (2) with a center line (X) is formed in the center region (3),
- wherein a first cross-sectional area (9) of the magnetic core in the center region (3) in a first section plane (6), which is parallel to the base (4*a*) and in which the center line (X) is located, is substantially equal to a second cross-sectional area (8) of the magnetic core (1) in a second section plane (7), which is perpendicular to the first section plane (6) and in which the center line (X) is located, and
- wherein the base (4*a*) and the cover (4*b*) protrude beyond the center region (3) in a direction of the center line (X) on at least two mutually opposing sides, and
- wherein the cover (4*b*), when viewed from a side of the magnetic core along a Y-axis extending in a direction perpendicular to the center line (X), has a T-shaped configuration.

2. The magnetic core as claimed in claim 1, wherein the base (4*a*) and the cover (4*b*) protrude by at least 5% of a length (40) of the center region (3).

3. The magnetic core as claimed in claim 2, wherein the base (4*a*) and the cover (4*b*) protrude by at least 10% of the length (40) of the center region (3).

4. The magnetic core as claimed in claim 3, wherein the base (4*a*) and the cover (4*b*) protrude by a maximum of 50% of the length (40) of the center region (3).

5. The magnetic core as claimed in claim 1, wherein the center region (3) has a first height (35) in a direction (Z) perpendicular to the base (4*a*), which height is at least 10% of a total height (50) of the magnetic core (1).

6. The magnetic core as claimed in claim 5, wherein the first height (35) is at least 20% of a total height (50) of the magnetic core (1).

7. The magnetic core as claimed in claim 6, wherein the first height (35) is a maximum of 40% of a total height (50) of the magnetic core (1).

8. The magnetic core as claimed in claim 1, wherein the base (4*a*) and the cover (4*b*) protrude beyond the center region (3) in the direction of the center line (X) on both sides.

9. The magnetic core as claimed in claim 8, wherein the base (4*a*) and the cover (4*b*) protrude beyond the center region (3) in the direction of the center line (X) on both sides symmetrically.

10. The magnetic core as claimed in claim 1, wherein the through-opening (2) extends from the base (4*a*) to the cover (4*b*).

11. The magnetic core as claimed in claim 1, wherein the base (4*a*) and the cover (4*b*) are each formed in the shape of a cuboidal plate.

12. The magnetic core as claimed in claim 11, wherein the base (4*a*) and the cover (4*b*) are arranged parallel to one another.

13. The magnetic core as claimed in claim 1, wherein the magnetic core (1) is formed in two parts.

14. The magnetic core as claimed in claim 13, wherein a gap (15) is formed between the center region (3) and the base (4*a*).

15. The magnetic core as claimed in claim 1, wherein the center region (3), the base (4*a*) and the cover (4*b*) are formed in one piece.

16. The magnetic core as claimed in claim 1, comprising two center regions (3*a*, 3*b*), each with a through-opening (2*a*, 2*b*), wherein the two center regions (3*a*, 3*b*) adjoin one another directly in a direction perpendicular to the second section plane (7*a*, 7*b*).

17. An electronic assembly, comprising:
- a magnetic core (1) as claimed in claim 1, and
- a printed circuit board (20), which penetrates through the through-opening (2) and is arranged parallel to the base (4*a*) of the magnetic core (1).

18. The electronic assembly as claimed in claim 17, furthermore comprising at least one electronic component (60), which is on the printed circuit board (20) and is at least partially covered by the base (4*a*) and the cover (4*b*) of the magnetic core (1).

19. The magnetic core as claimed in claim 1, wherein a length of the cover (4*b*) along the center line (X) is longer than a length of the base (4*a*) along the center line (X).

20. The magnetic core as claimed in claim 1, wherein an electronic component (60) is arranged on the center line (X)

and within a space which is defined by a region where the base (4*a*) and the cover (4*b*) protrude beyond the center region (3).

* * * * *